(12) United States Patent
Frey

(10) Patent No.: US 6,939,743 B2
(45) Date of Patent: Sep. 6, 2005

(54) SPLIT-GATE POWER MODULE AND METHOD FOR SUPPRESSING OSCILLATION THEREIN

(75) Inventor: Richard B. Frey, Bend, OR (US)

(73) Assignee: Advanced Power Technology, Inc., Bend, OR (US)

( * ) Notice: Subject to any disclaimer, the term of this patent is extended or adjusted under 35 U.S.C. 154(b) by 123 days.

(21) Appl. No.: 10/352,314

(22) Filed: Jan. 27, 2003

(65) Prior Publication Data

US 2003/0141587 A1 Jul. 31, 2003

Related U.S. Application Data

(60) Provisional application No. 60/353,809, filed on Jan. 29, 2002.

(51) Int. Cl.$^7$ ............................................. H01L 21/44

(52) U.S. Cl. ...................................... 438/117; 438/106

(58) Field of Search ................................. 257/724, 678, 257/691, 725; 438/197, 106, 117, 107

(56) References Cited

U.S. PATENT DOCUMENTS

| | | | |
|---|---|---|---|
| 4,639,760 A | | 1/1987 | Granberg et al. |
| 4,907,068 A | * | 3/1990 | Amann et al. ............... 257/724 |
| 5,258,646 A | * | 11/1993 | Katoh .......................... 257/678 |
| 5,731,970 A | * | 3/1998 | Mori et al. ................... 363/132 |
| 6,291,878 B1 | * | 9/2001 | Anderson et al. ........... 257/691 |

FOREIGN PATENT DOCUMENTS

| | | | |
|---|---|---|---|
| DE | 19644009 A1 | 5/1998 | ............ H01L/25/07 |
| EP | 645815 A2 | 3/1995 | ............ H01L/23/64 |

OTHER PUBLICATIONS

SGS–Thomson Microelectronics Data Sheet for SD1728 (TH430); Nov. 1992; 9 pages.
M/A–COM Semiconductor Technical Data; MRF154; RF Power Field Effect Transistor; Rev. 2; 7 pages.
TPM1919–40–311; 6 pages.

* cited by examiner

Primary Examiner—Howard Weiss
Assistant Examiner—(Vikki) Hoa B. Trinh
(74) Attorney, Agent, or Firm—Marger Johnson & McCollom, P.C.

(57) ABSTRACT

The invention involves a method of packaging and interconnecting four power transistor dies to operate at a first frequency without oscillation at a second frequency higher than the first frequency but lower than a cutoff frequency of the transistors. The method comprises mounting the dies on a substrate with a lower side (drain) of each die electrically and thermally bonded to a first area of a conductive layer on the substrate; electrically connecting a source of each die to a second area of the conductive layer on the substrate; and electrically connecting a gate of each die to a third, common interior central area of the conductive layer on the substrate via separate electrical leads. The leads are sized to substantially the same electrical length and providing a first impedance corresponding to said electrical length from the common area to each gate that will pass the first frequency substantially unattenuated and providing a second impedance from the gate of one die to the gate of a second die that will substantially attenuate the second frequency. In accordance with a first embodiment, the leads take the form of one or more jumper wires in series with a film resistor. In accordance with a second embodiment, they take the form of one or more meandering striplines having predefined impedance characteristics, and one or more gate bonding pads connected to their respective gates with long jumper wires.

8 Claims, 5 Drawing Sheets

US 6,939,743 B2

SPLIT-GATE POWER MODULE AND METHOD FOR SUPPRESSING OSCILLATION THEREIN

This application claims priority from U.S. Provisional Application Ser. No. 60/353,809, filed Jan. 29, 2002.

FIELD OF THE INVENTION

The present invention relates to power modules containing plural transistor dies providing a single external gate terminal. More particularly, it concerns a power module that operates at a first frequency without oscillation at a second higher frequency that is below a cutoff frequency of the transistors.

BACKGROUND OF THE INVENTION

Prior art power module devices utilizing plural transistor dies are known. FIGS. 1 and 2 illustrate two such prior art configurations, FIG. 1 illustrating a device known as the SGS Thompson TH430 and FIG. 2 illustrating a device known as the Toshiba TPM1919.

The SGS Thompson TH430 shown in FIG. 1 is a four-die bipolar device incorporating a center base feed with the emitters on the outside of the rectangular array. There is no provision in this design for equalizing the path length from the base terminal to the individual die bases. It is believed that the upper frequency of the die, referred to herein as the cutoff frequency of the transistors, is close to the 50 MHz upper frequency limit of the four-die device.

The Toshiba TPM1919 shown in FIG. 2 is a 2 GHz device having four MESFET dies in a linear array. It uses an "echelon" divider structure to divide the gate signal four ways. There are matching networks between the gate connections and the ends of the divider structure. It is believed that these matching networks provide impedance transformation at the intended frequency of operation which facilitates implementation of the device. The device's input structure provides certain balancing and isolation functions. Its frequency of operation is believed to be near the upper limit of the individual dies.

Accordingly, the known prior art devices operate at the top end of the dies' frequency capability. The prior art gate and/or base wires are necessarily short because of the very high frequencies involved. As a result, their parasitic resonant (and potential oscillation) frequency is higher than the frequency at which the dies run out of gain. Thus, there is little or no oscillation.

The Motorola design MRF 154 (FIG. 2') is described in U.S. Pat. No. 4,639,760 uses series gate resistors to intentionally substantially reduce the gain of the individual gate cells to substantially prevent oscillation. The die has gain response to >500 MHz, but the intended frequency range of the total device was <100 MHz. Thus, the Motorola design has excess gain.

SUMMARY OF THE INVENTION

The invention involves a method of packaging and interconnecting four power transistor dies to operate at a first frequency without oscillation at a second frequency higher than the first frequency but lower than a cutoff frequency of the transistors. The method comprises mounting the dies on a substrate with a lower side (drain) of each die electrically and thermally bonded to a first area of a conductive layer on the substrate; electrically connecting a source of each die to a second area of the conductive layer on the substrate; and electrically connecting a gate of each die to a third, common interior central area of the conductive layer on the substrate via separate electrical leads.

The leads are sized to substantially the same electrical length and provide a first impedance corresponding to said electrical length from the common area to each gate that will pass the first frequency substantially unattenuated and providing a second impedance from the gate of one die to the gate of a second die that will substantially attenuate the second frequency. In accordance with a first embodiment, the leads take the form of one or more jumper wires in series with a film resistor. In accordance with a second embodiment, they take the form of one or more meandering striplines having predefined impedance characteristics and one or more gate bonding pads connected to their respective gates with long jumper wires.

BRIEF DESCRIPTION OF THE DRAWINGS

FIG. 2' illustrates a third prior art power amplifier.

DETAILED DESCRIPTION

Figure 1:
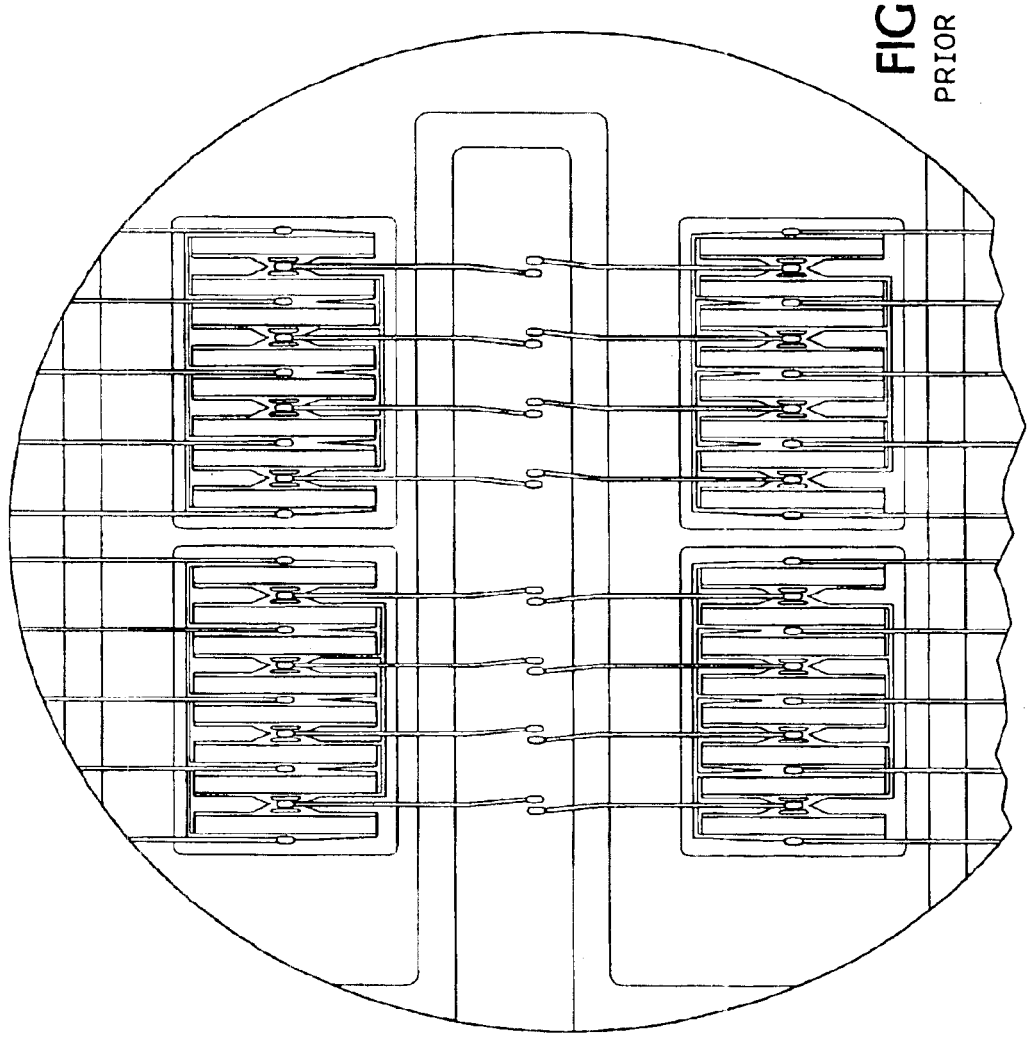
FIG. 1 illustrates prior art power amplifier.
Figure 2:
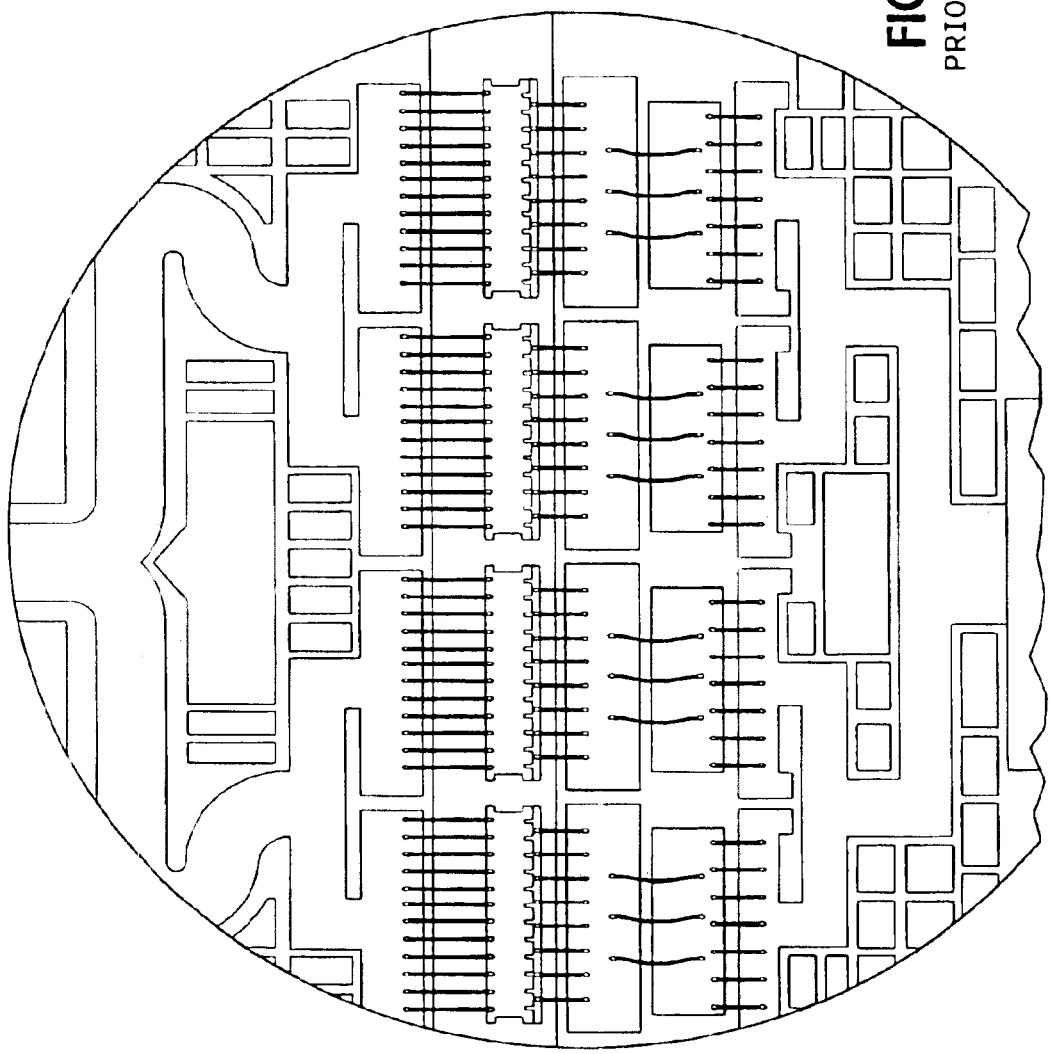
FIG. 2 illustrates another prior art power amplifier.
Figure 2:
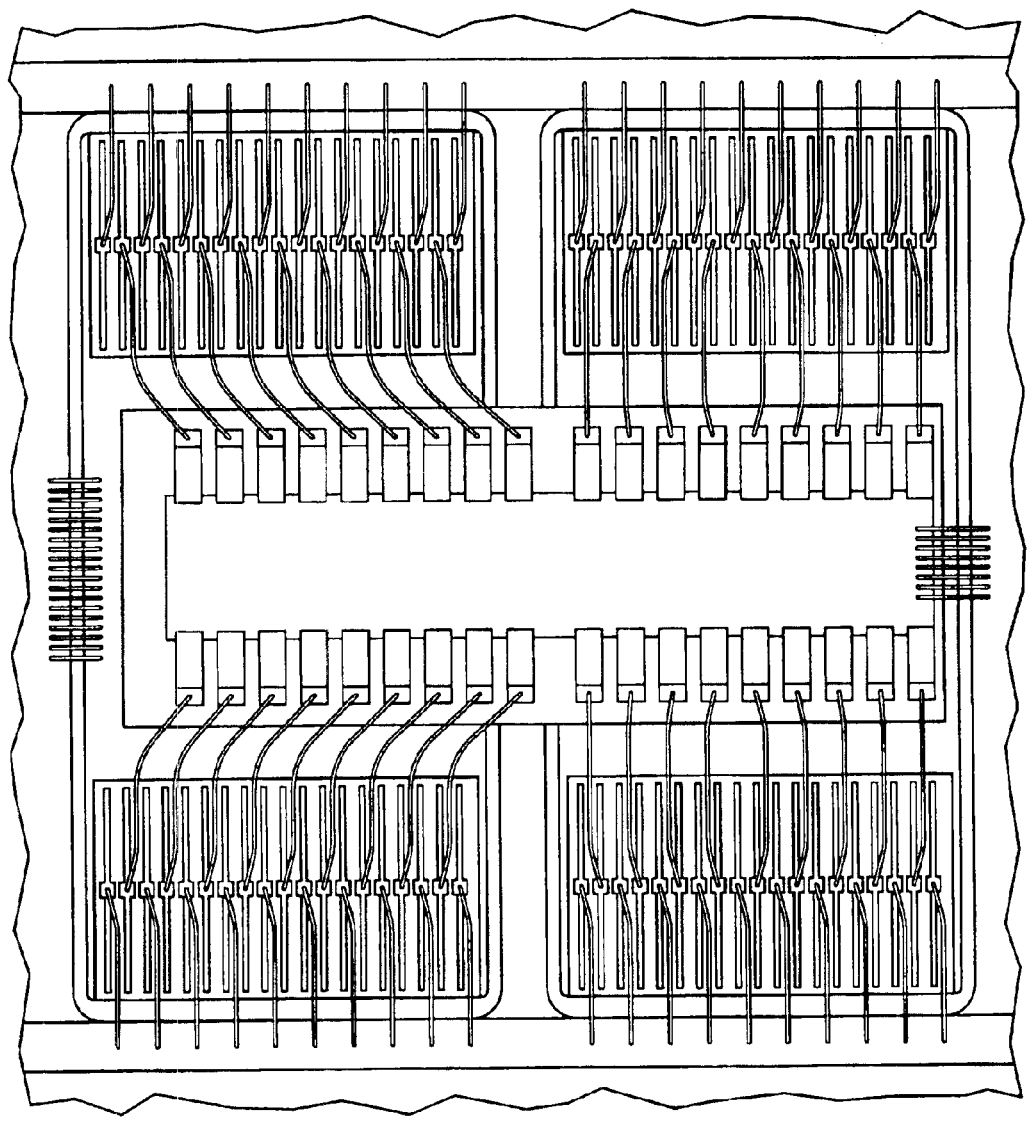
Figure 3:
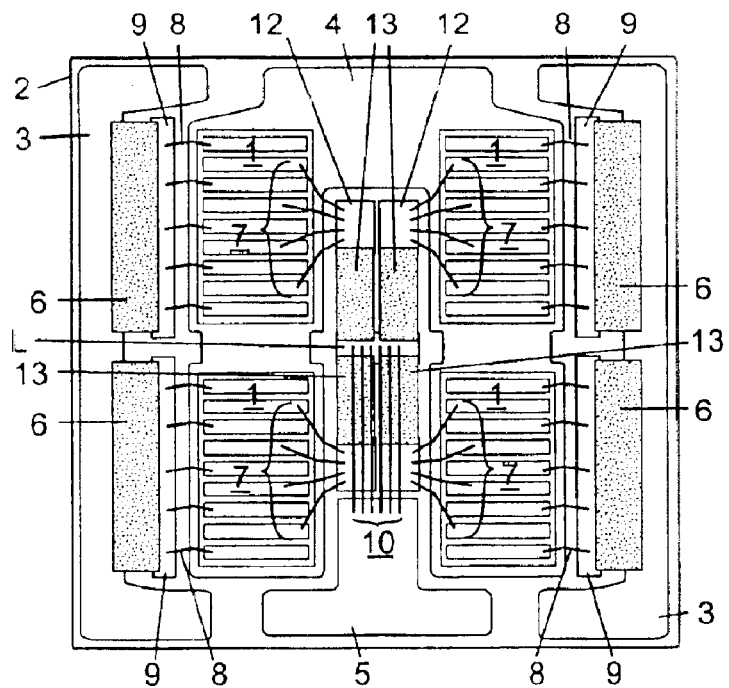
FIG. 3 is a schematic diagram of a first embodiment of the present invention.
Figure 4:
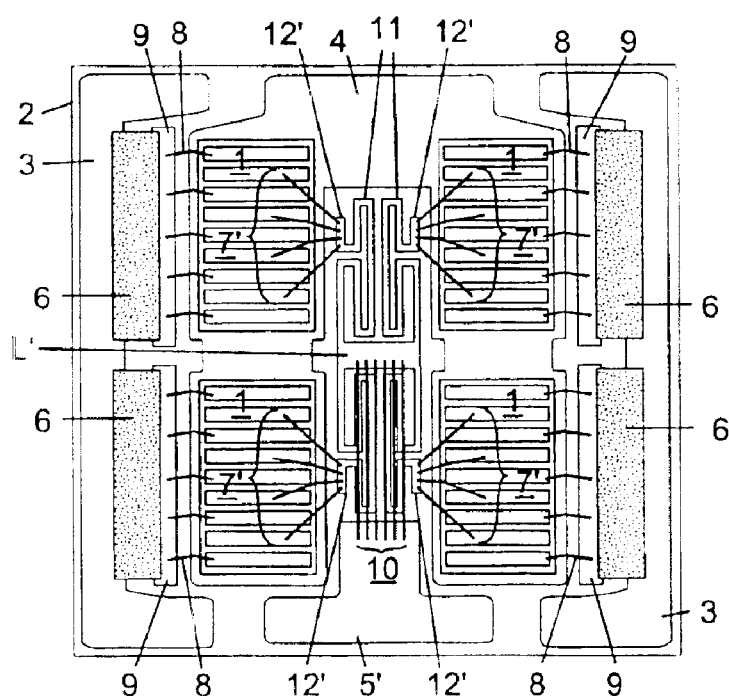
FIG. 4 is a schematic diagram of a second embodiment of the present invention.

In accordance with the present invention, four power MOSFET transistor dies are arranged in a rectangular, e.g. a square, array, as shown in FIGS. 3 and 4. The dies have an upper limit of 250 MHz, but they are twice as large as the dies in the Motorola design. As a result, the input capacitance of the transistors, in accordance with the invention, is high. This high capacitance lowers the resonant frequency of the parasitic structure of the transistors, which can cause oscillation when the transistors are coupled in parallel in a power module. Because of the higher input capacitance and the use of source resistors, in accordance with a first embodiment of the invention, the gain at the intended frequency of operation is not very high to begin with. Thus, there is little excess gain, and the gate resistors alone decrease overall amplifier gain. If the resistance needed to suppress oscillation is too high, then inductors may be used instead. Thus a second embodiment of the invention utilizes gate inductors instead of gate resistors, and provides higher gain without oscillation.

The invention may be seen to provide a reliable, easily and repeatably manufactured, modular configuration of multiple power MOSFET dies designed for RF power applications.

FIG. 3 illustrates a first embodiment of the invention having balanced gate input connections that utilize printed series resistors. Those of skill in the art will appreciate that, in this first embodiment, a relatively lower gain amplifier is obtained, but one that performs without undesirable oscillation. Those of skill also will appreciate that, to increase the gain of such an amplifier embodiment, smaller dies having greater gain may be used so that the series resistors do not consume most of the gain margin at the desired operating frequency.

FIG. 3 shows the four-die (each labeled 1) array mounted on a preferably ceramic (e.g. BeO) substrate 2 providing a conductive source connection area 3, a conductive drain connection area 4 and a conductive gate connection area 5. Thin-film source resistors 6 (e.g. palladium gold) are located on the substrate outside the perimeter of the die array. Gate bond wires 7 and source bond wires 8 (e.g. aluminum), as well as source bond pads 9 (e.g. silver) are provided, as shown. Jumper wires 10 (e.g. aluminum) extend from gate connection area 5 to a centrally located gate landing L adjacent and electrically connected to gate series resistors 13. The far ends of gate resistors 13 are wire bonded by gate bond wires 7 to plural corresponding gate connections on each of the dies 1.

FIG. 4 shows a second embodiment of the invention having balanced gate input connections that utilize printed meandering striplines or stripline connection lines 11 exhibiting a relatively high intrinsic inductance. Because the impedance of the inductive striplines is frequency-dependent (unlike that of the resistors, which is frequency-independent), it is possible to achieve higher gain without oscillation in this second embodiment of the invention. It will be appreciated that the layout topology of the second embodiment is like that of the first: the gates' first off-die connection is to be in a common interior central location therein. Those of skill in the art will appreciate that the striplines also intrinsically have a characteristic resistance and capacitance, however low.

It may be seen from FIG. 4 that the meandering striplines are of substantially equal electrical length, i.e. they exhibit nearly identical impedances (including resistance, inductance and capacitance), and extend from an external gate terminal 5' through jumper wires 10 to a central common landing region L' within the die array and between adjacent dies. The meandering inductors terminate in gate bonding pads 12' for wire bonding using gate bond wires 7' to the plural corresponding gate pads on each of the dies 1. It will be understood that substrate 2, source connection area 3, drain connection area 4, source resistors 6, source bond wires 8 and source bond pads 9 are substantially identical to those of the first embodiment of the invention described above relative to FIG. 3. Those of skill in the art will appreciate that the meandering nature of the striplines effectively electrically lengthens the leads, without substantially increasing the required connection layout area.

Figure 5:
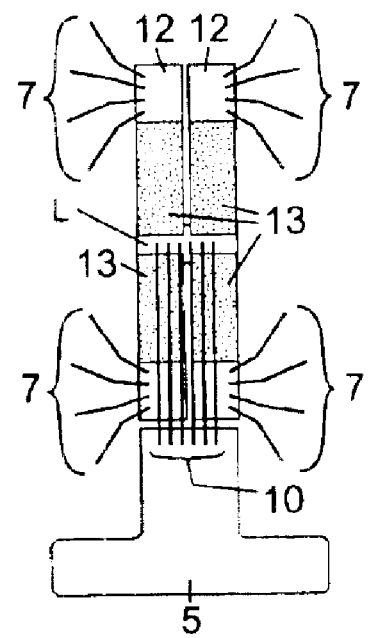
FIG. 5 is a more detailed schematic diagram of the gate structure of the embodiment shown in FIG. 3.

FIG. 5 is a detailed schematic diagram showing only the gate connection area of the device of FIG. 3. FIG. 5 features the above-described gate connection 5 for the device and bond wires 7. It also shows second (central) gate connection bond wires 10 (six in accordance with the first embodiment shown) providing a controlled-impedance (e.g. resistive/inductive/capacitive) path between gate connection 5 and the centrally located gate landing L. It further shows the gate bonding pads 12 (one per die). Finally, it shows preferably printed circuit resistors 13 (also one per die). The number of jumper wires 10 and their lengths may be adjusted to achieve desired inductance, resistance and current capacity for a given application.

In accordance with a preferred first embodiment, the gate series resistors are approximately 3Ω or less. Those of skill in the art will appreciate that the series resistance value is selected to effectively suppress oscillation at a given operating frequency of the device, while not reducing the overall gain of the device more than is necessary. Also, as illustrated in the preferred first embodiment, the six thin jumper wires 10 are arranged in parallel.

Figure 6:
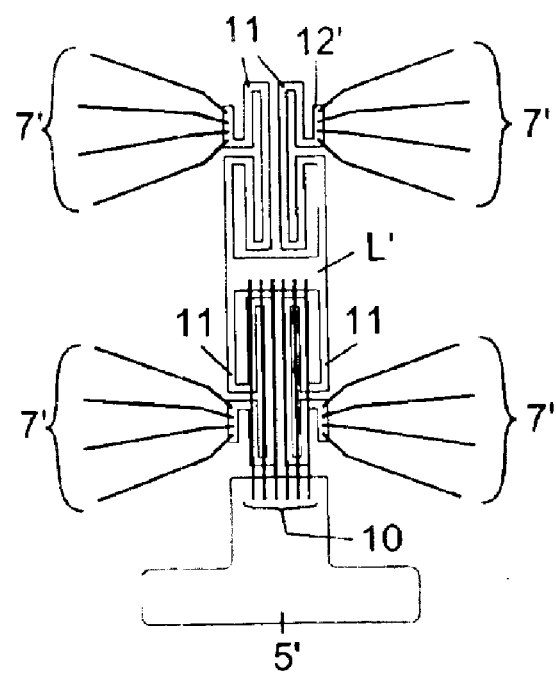
FIG. 6 is a more detailed schematic diagram of the gate structure of the embodiment shown in FIG. 4.

FIG. 6 is a detailed schematic diagram showing only the gate connection area of the device of FIG. 4. As described above with reference to FIG. 4, the second embodiment of the invention omits the gate series resistors 13, reconfigures the gate bonding pads 12' to a smaller footprint, and incorporates four controlled-impedance stripline connection lines 11 extending as shown between a common central landing L' and bonding pads 12'. The landing L' may be seen to be connected to the gate connection 5' via six parallel jumper wires 10, as in FIGS. 3 and 5.

The typical characteristic impedance of the controlled-impedance striplines—compatible with the selected dies—is approximately 90Ω, as determined by their width and the thickness and dielectric properties of the substrate 2. In accordance with the second embodiment of the invention described above by reference to FIGS. 4 and 6, the striplines are approximately 0.65 inch long and 0.013 inch wide, while the substrate is approximately 40 mils thick. The input impedance of the dies 1 themselves is less than approximately 0.2Ω.

Those of skill in the art will appreciate that the ratio of conductor width to dielectric layer thickness determines the characteristic impedance, and that the length of the conductor determines the series impedance the meandering stripline imparts between the gate and the common connection point L'. Those of skill in the art also will appreciate that the illustrated striplines may be differently characterized, formed and/or routed, within the spirit and scope of the invention.

For purpose of description, a rectangular array of four-die is represented. Other geometric arrangements, circular, triangular, etc., with more or less die could also be used with the method described, and are within the spirit and scope of the invention.

Accordingly, having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A method of packaging and interconnecting plural power transistor dies to operate at a first frequency, without oscillation at a second frequency higher than said first frequency but lower than a cutoff frequency of the transistors, the method comprising:

mounting the dies on a substrate with a lower side (drain) of each die electrically and thermally bonded to a first area of a conductive layer on the substrate;

electrically connecting a source of each die to a second area of the conductive layer on the substrate; and electrically connecting a gate of each die to a third, common, interior central landing area of the conductive layer on the substrate via separate electrical leads, the leads being sized to substantially the same electrical length and providing a first impedance corresponding to said electrical length from the common area to each gate that will pass the first frequency substantially unattenuated and providing a second impedance from the gate of one die to the gate of a second die that will substantially attenuate the second frequency.

2. A method according to claim 1, wherein the plural dies are arranged in an array, and the substrate is arranged so that the second area coupled to the sources is positioned outside the array and the third area is interior and central to the array and between the dies.

3. A method according to claim 1, wherein the plural dies are arranged in an array, which further comprises a set of conductive first jumper wires connecting the third area to a fourth area, and wherein the substrate is arranged so that the second area coupled to the sources is positioned outside of the array on opposite first and second sides, the third area is positioned approximately centrally within the array and the fourth area is substantially outside the array.

4. A method of packaging and interconnecting plural power transistor dies to operate at a first frequency, without oscillation at a second frequency higher than said first frequency but lower than a cutoff frequency of the transistors, the method comprising:

mounting the dies on a substrate with a lower side (drain) of each die electrically and thermally bonded to a first area of a conductive layer on the substrate;

electrically connecting a source of each die to a second area of the conductive layer on the substrate; and electrically connecting a gate of each die to a third, common, interior central landing area of the conductive layer on the substrate via separate electrical leads, the leads being sized to substantially the same electrical length and providing a first impedance corresponding to said electrical length from the common area to each gate that will pass the first frequency substantially unattenuated and providing a second impedance from the gate of one die to the gate of a second die that will substantially attenuate the second frequency;

wherein the leads each include a first portion extending from the third area to a gate pad corresponding to the gate of a respective die, the first portion including one or more controlled-impedance films, a second portion connected in series with the first portion, the second portion including the gate pad and a third portion connected in series with the second portion, the third portion including one or more conductive jumpers extending to the gate of the respective die.

5. A method according to claim 4, wherein at least the first and second portions of the leads are integrally formed in the conductive layer so as to delineate lines of substantially equal, defined impedance on the substrate having substantially equal resistance, inductance and capacitance, and wherein the conductive jumpers are configured to be of substantially equal, defined impedance coupling each gate pad to a respective gate.

6. A method of packaging and interconnecting plural power transistor dies to operate at a first frequency, without oscillation at a second frequency higher than said first frequency but lower than a cutoff frequency of the transistors, the method comprising:

mounting the dies on a substrate with a lower side (drain) of each die electrically and thermally bonded to a first area of a conductive layer on the substrate;

electrically connecting a source of each die to a second area of the conductive layer on the substrate; and electrically connecting a gate of each die to a third, common, interior central landing area of the conductive layer on the substrate via separate electrical leads, the leads being sized to substantially the same electrical length and providing a first impedance corresponding to said electrical length from the common area to each gate that will pass the first frequency substantially unattenuated and providing a second impedance from the gate of one die to the gate of a second die that will substantially attenuate the second frequency;

wherein the leads each include a first portion that is integrally formed in the conductive layer and that extends between the third area and an electrically-separate gate pad corresponding with one of the dies, the first portion taking the form of a meandering stripline, and wherein the leads each include a second portion that includes a first set of plural conductive jumpers configured to be of substantially equal, defined impedance coupling each gate pad to the respective gate.

7. The method of claim 6, wherein the plural dies are arranged in an array; which further comprises a set of conductive first jumper wires connecting the third area to a fourth area, and wherein the substrate is arranged so that the second area coupled to the sources is positioned outside of the array on opposite first and second sides, the third area is positioned approximately centrally within the array and the fourth area is substantially outside the array.

8. The method of claim 2, 3, or 7, wherein the array is rectangular.

* * * * *